US012813335B2

(12) United States Patent
Wu et al.

(10) Patent No.: US 12,813,335 B2
(45) Date of Patent: Nov. 24, 2026

(54) DISPLAY PANEL

(71) Applicant: Prilit Optronics, Inc., Tainan City (TW)

(72) Inventors: Biing-Seng Wu, Tainan City (TW); Tzung-Ren Wang, Tainan City (TW)

(73) Assignee: Prilit Optronics, Inc., Tainan City (TW)

( * ) Notice: Subject to any disclaimer, the term of this patent is extended or adjusted under 35 U.S.C. 154(b) by 378 days.

(21) Appl. No.: 18/212,430

(22) Filed: Jun. 21, 2023

(65) Prior Publication Data

US 2024/0006397 A1 Jan. 4, 2024

Related U.S. Application Data

(60) Provisional application No. 63/357,005, filed on Jun. 30, 2022.

(51) Int. Cl.
*H10W 90/00* (2026.01)
*H10W 72/00* (2026.01)
*H10W 72/20* (2026.01)

(52) U.S. Cl.
CPC ...... *H10W 90/00* (2026.01); *H10W 72/07235* (2026.01); *H10W 72/232* (2026.01); *H10W 72/234* (2026.01); *H10W 72/248* (2026.01); *H10W 90/724* (2026.01)

(58) Field of Classification Search
CPC ......... H01L 24/13; H01L 24/14; H01L 24/16; H01L 24/81; H01L 25/167; H01L 2224/13014; H01L 2224/13016; H01L 2224/14134; H01L 2224/14155; H01L 2224/16225; H01L 2224/81224; H01L 2924/1426; G09F 9/33; G09F 9/35
See application file for complete search history.

(56) References Cited

U.S. PATENT DOCUMENTS

| | | | | |
|---|---|---|---|---|
| 2005/0205975 | A1* | 9/2005 | Kang et al. | 257/678 |
| 2007/0002084 | A1* | 1/2007 | Kimura et al. | 345/694 |
| 2010/0096739 | A1* | 4/2010 | Kawabata et al. | 257/686 |
| 2013/0043584 | A1* | 2/2013 | Kwon et al. | |
| 2019/0096864 | A1* | 3/2019 | Huitema et al. | H01L 25/167 |
| 2020/0203420 | A1* | 6/2020 | Wu et al. | H01L 27/156 |
| 2020/0243735 | A1* | 7/2020 | Lee et al. | H01L 33/60 |
| 2020/0321391 | A1* | 10/2020 | Danesh et al. | H01L 27/156 |
| 2022/0359468 | A1* | 11/2022 | Tsai et al. | H01L 25/0657 |

* cited by examiner

*Primary Examiner* — Nathan W Ha
(74) *Attorney, Agent, or Firm* — Donald E. Stout; Stout, Uxa & Buyan, LLP

(57) ABSTRACT

A display panel includes a substrate composed of a plurality of pixels; and a plurality of integrated circuits (ICs) disposed on a top surface of the substrate, each IC including a plurality of IC pads and the substrate including a plurality of substrate pads corresponding to the IC pads and disposed on the top surface of the substrate. In one embodiment, the ICs are bonded on the substrate via the IC pads and the substrate pads, which are interconnected by laser as a heat source. In another embodiment, each IC is disposed above to cover up at least one pixel.

18 Claims, 8 Drawing Sheets

200

DISPLAY PANEL

CROSS-REFERENCE TO RELATED APPLICATIONS

This application claims the benefit under 35 U.S.C. 119 of U.S. Provisional Application No. 63/357,005, filed on Jun. 30, 2022, the entire content of which are herein expressly incorporated by reference.

BACKGROUND OF THE INVENTION

1. Field of the Invention

The present invention generally relates to a display panel, and more particularly to a display panel with increased pixel density or reduced border.

2. Description of Related Art

Conventional flat-panel displays, such as liquid-crystal displays (LCD) or micro-light-emitting diode (microLED, mLED or μLED) displays, adopt anisotropic conductive film (ACF) to bond drivers on the substrate. As pressure is required while bonding the drivers with the ACF, driver pads need be disposed on at least two opposite sides (i.e., dual side) of the drivers in consideration of pressure equilibrium. As a result, less area may be allocated for pixels, and pixel density of the displays and fan-out of the driver pads are substantially limited.

In some conventional flat-panel displays, drivers are commonly disposed between adjacent rows of pixels or on border. As a result, pixel density of the displays and fan-out of the driver pads are substantially decreased. Further, as the drivers are close to neighbor pixels or on border, it is inconvenient to perform repairing or re-bonding the drivers or it is difficult to achieve slim border requirement.

A need has thus arisen to propose a novel scheme to overcome drawbacks of the conventional flat-panel displays.

SUMMARY OF THE INVENTION

In view of the foregoing, it is an object of the embodiment of the present invention to provide a display panel with increased pixel density or reduced border, having integrated circuits (ICs) with high fan-out, and facilitating repairing and re-bonding the ICs.

According to one embodiment, a display panel includes a substrate and a plurality of integrated circuits (ICs). The substrate is composed of a plurality of pixels. The ICs are disposed on a top surface of the substrate, each IC including a plurality of IC pads and the substrate including a plurality of substrate pads corresponding to the IC pads and disposed on the top surface of the substrate. In one embodiment, the ICs are bonded on the substrate via the IC pads and the substrate pads, which are interconnected by laser as a heat source. In another embodiment, each IC is disposed above to cover up at least one pixel.

DETAILED DESCRIPTION OF THE INVENTION

Figure 1A:
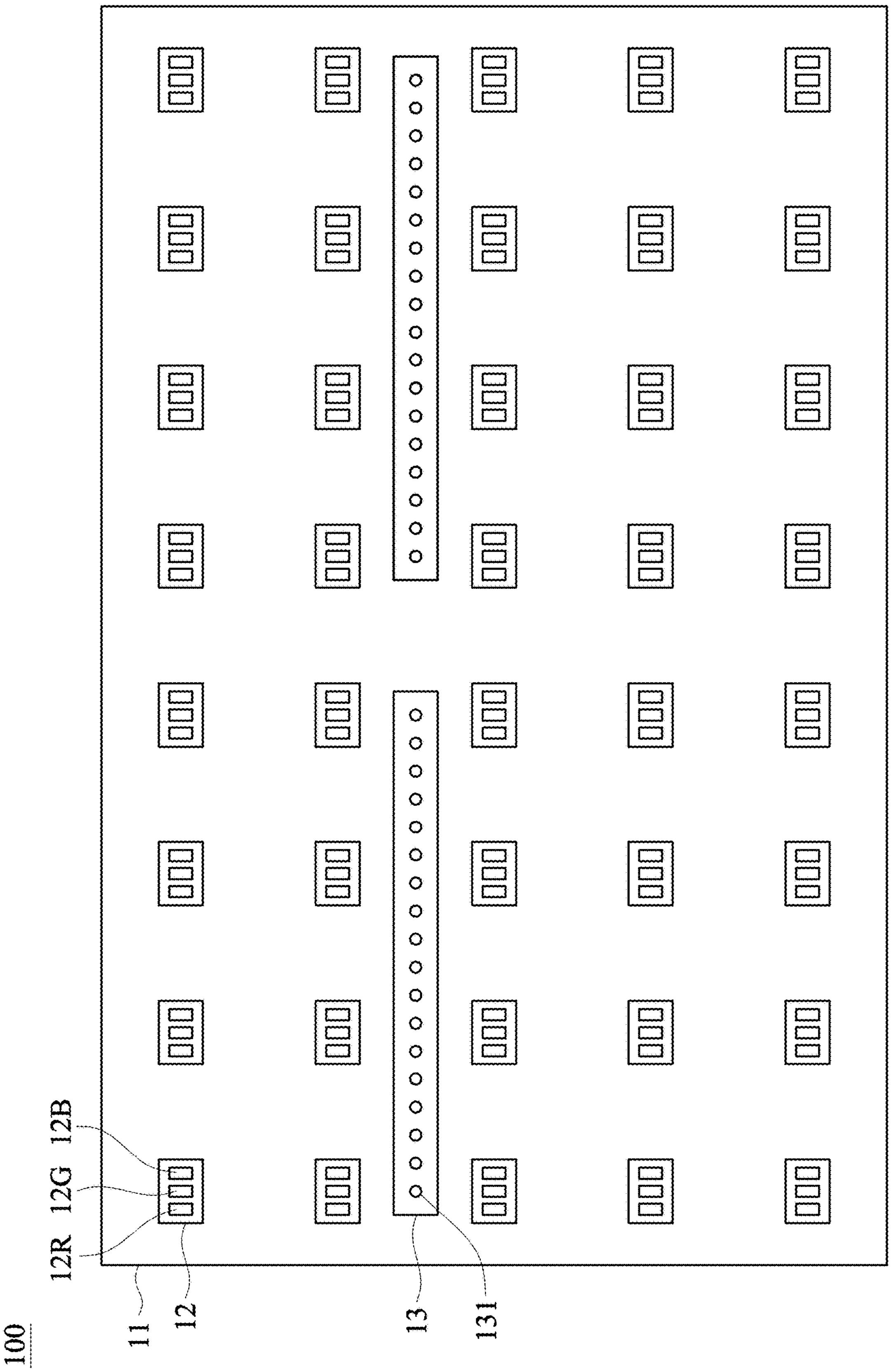
FIG. 1A shows a top view illustrating a display panel according to a first embodiment of the present invention.
Figure 1B:
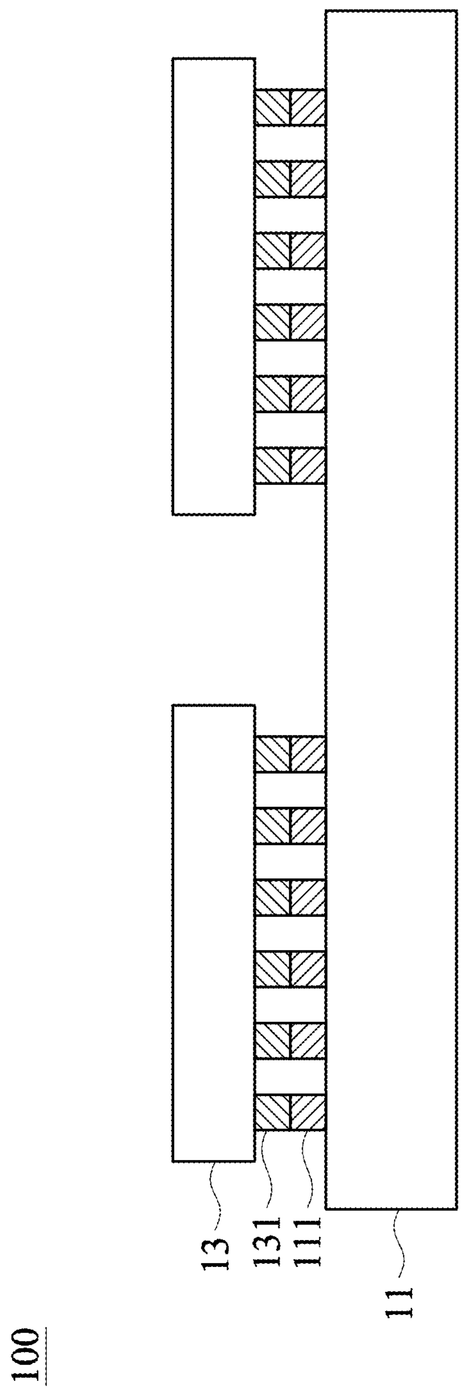
FIG. 1B shows a side view of the display panel of FIG. 1A.

FIG. 1A shows a top view illustrating a display panel 100 according to a first embodiment of the present invention. The display panel 100 may, for example, be a liquid-crystal display (LCD) panel or a micro-light-emitting diode (microLED) display panel. FIG. 1B shows a side view of the display panel 100 of FIG. 1A.

In the embodiment, the display panel 100 may include a substrate 11 composed of a plurality of pixels 12, each including a red sub-pixel 12R, a green sub-pixel 12G and a blue sub-pixel 12B. The substrate 11 may, for example, be made of an insulating material (e.g., glass or Acrylic) or other materials (such as printed circuit board or PCB).

Figure 1C:
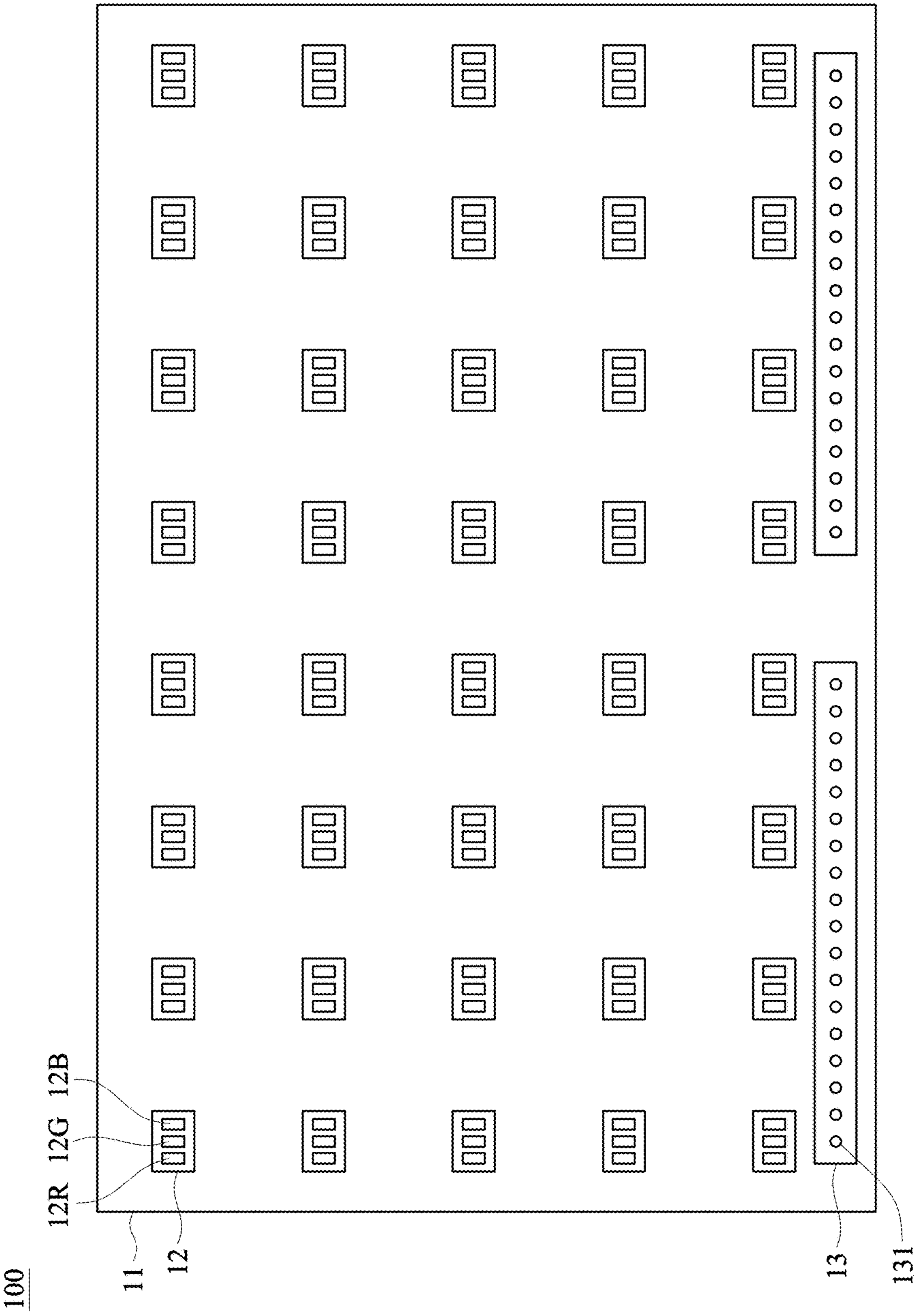
FIG. 1C shows a top view illustrating a display panel according to an alternative first embodiment of the present invention.

The display panel 100 may include a plurality of integrated circuits (ICs) 13 such as drivers (e.g., display driver integrated circuits or DDICs), which are disposed (or bonded) on a (top) surface of the substrate 11. As exemplified in FIG. 1A, the ICs 13 are disposed between adjacent rows of pixels 12. FIG. 1C shows a top view illustrating a display panel 100 according to an alternative first embodiment of the present invention, in which the ICs 13 are disposed on a periphery of the substrate 11.

Specifically, as shown in FIG. 1B, each IC 13 may include a plurality of IC pads 131 disposed on a bottom surface of the IC 13. The substrate 11 may include a plurality of substrate pads 111 corresponding to the IC pads 131 and disposed on a top surface of the substrate 11. According to one aspect of the embodiment, the ICs 13 are bonded on the substrate 11 via the IC pads 131 and the substrate pads 111, which are interconnected by laser as a heat source. Therefore, the ICs 13 are bonded on the substrate 11 without adopting anisotropic conductive film (ACF) and applying pressure as in the conventional display panels.

According to another aspect of the embodiment (of FIG. 1A or FIG. 1C), the IC pads 131 are disposed on a single (longitudinal) side of the corresponding IC 13, as compared to the conventional display panels with dual-side IC pads. Accordingly, the ICs 13 of the embodiment may be manufactured smaller or thinner, more area of the substrate 11 may be allocated for the pixels 12, and pixel density of the display panel 100 may be substantially increased. Further, the IC pads 131 as disposed on a single (longitudinal) side of the corresponding IC 13 may facilitate repairing or re-bonding the ICs 13. Moreover, because the ACF hot pressing process is not used in the embodiment, adjacent IC pads 131 will not be easily short-circuited due to the ACF hot pressing process. That is, the traditional ACF hot pressing process will reserve distance between pads to avoid short-circuit, so the pixel density cannot be effectively increased. The IC pads 131 of the embodiment are suitable for laser bonding, so the pixel density can be effectively increased. As the present embodiment eliminates the need for ACF hot pressing processing and allows for IC pads 131 to have a fine pitch, the size of the ICs 13 therefore can be substantially reduced.

Figure 1D:
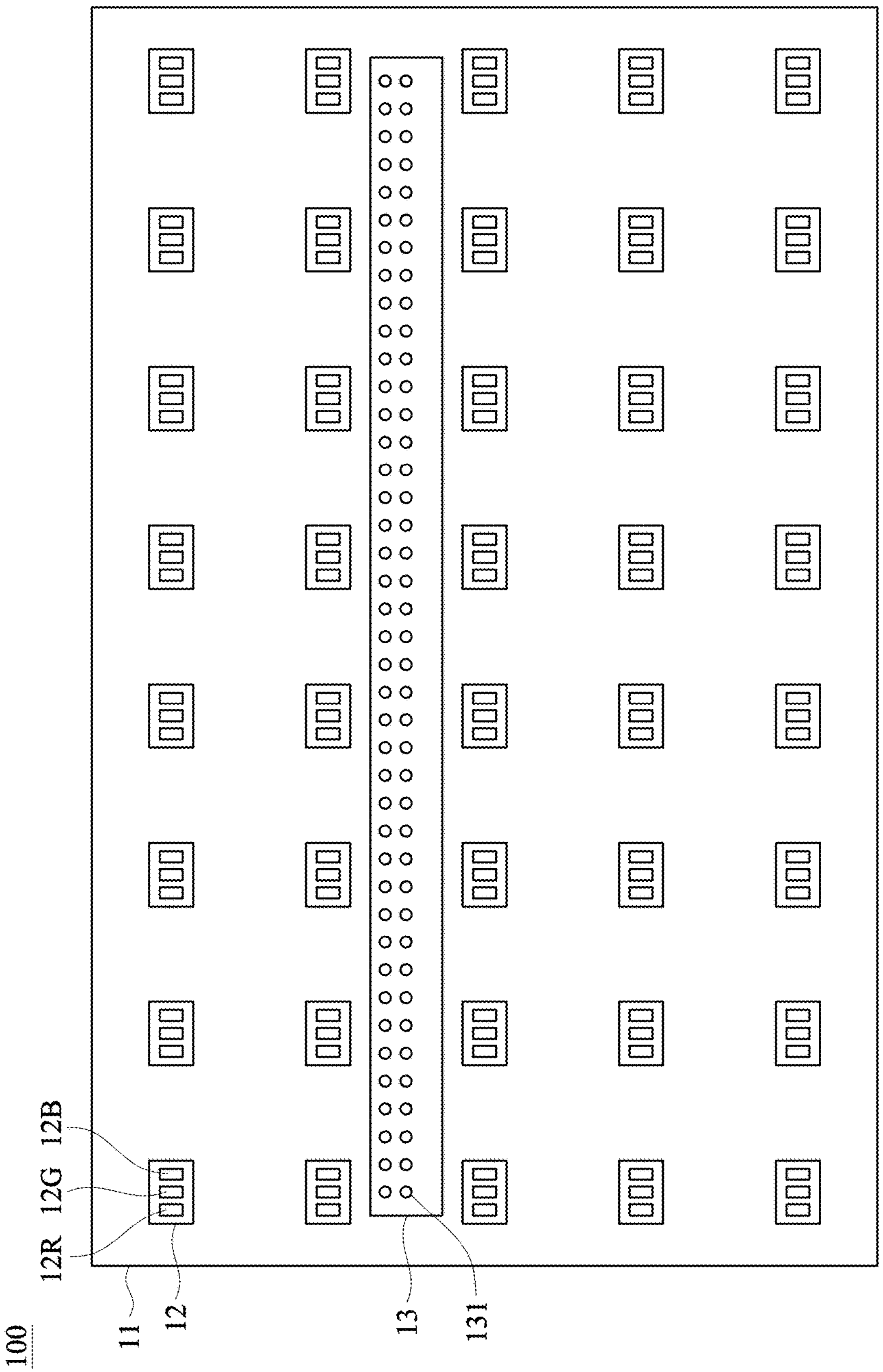
FIG. 1D shows a top view illustrating a display panel according to a further first embodiment of the present invention.

FIG. 1D shows a top view illustrating a display panel 100 according to a further first embodiment of the present invention, in which the IC pads 131 are disposed on at least two longitudinal rows of the corresponding IC 13, and the longitudinal rows are asymmetrically disposed, for example, on upper part of the IC 13.

Figure 2A:
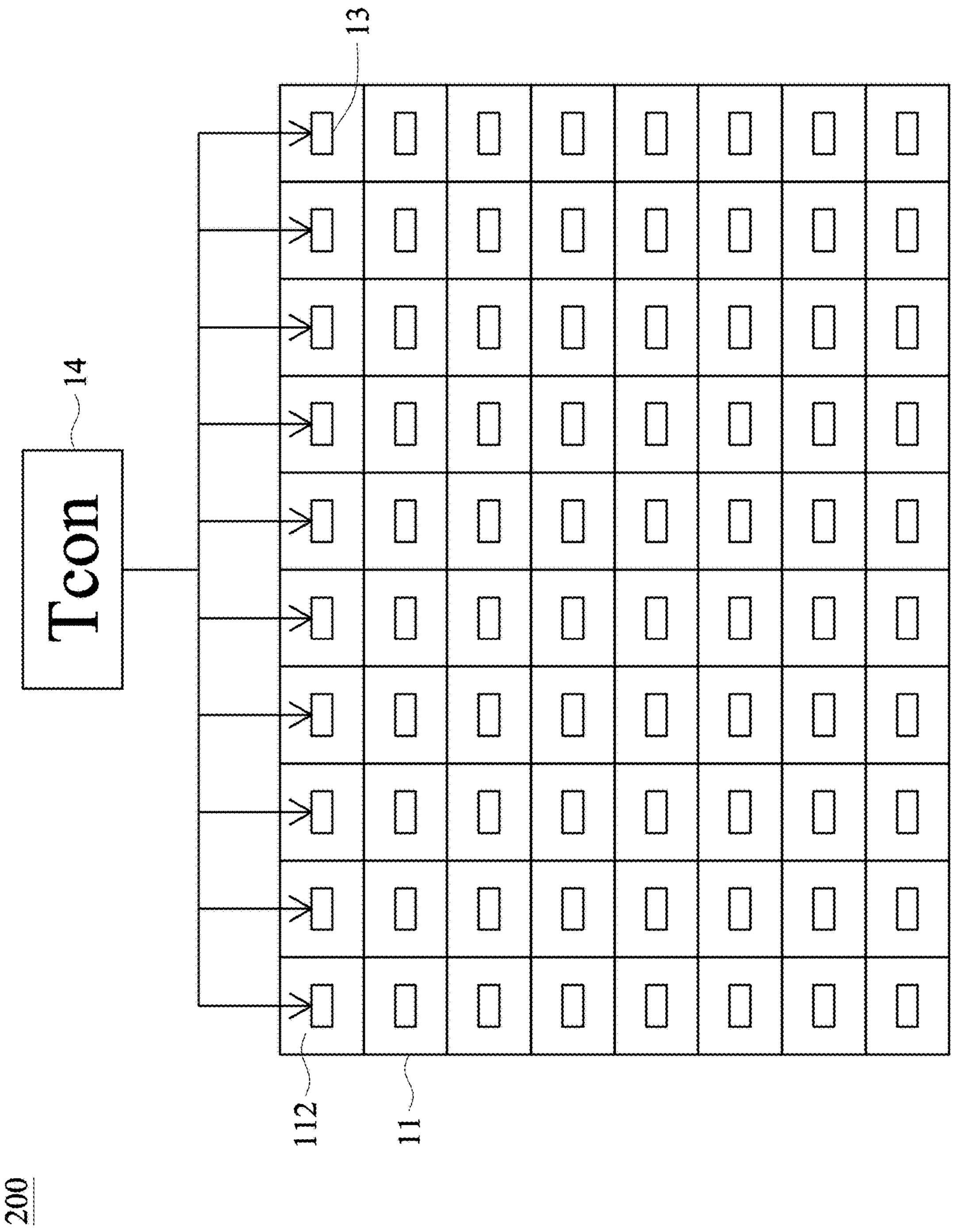
FIG. 2A shows a top view illustrating a display panel according to a second embodiment of the present invention.

FIG. 2A shows a top view illustrating a display panel 200 according to a second embodiment of the present invention. A bottom-emission microLED display panel is exemplified here.

In the embodiment, the display panel 200 may include a substrate 11 for supporting a plurality of microLEDs (not shown). The substrate 11 may be preferably made of an insulating material (e.g., glass or Acrylic) or other materials suitable for supporting the microLEDs. Specifically, the substrate 11 is divided into a plurality of blocks 112.

The display panel 200 may include a plurality of ICs 13 such as drivers (e.g., display driver integrated circuits or DDICs), which are correspondingly disposed on (e.g., top) surfaces of the blocks 112 respectively. Each block 112 may have at least one corresponding IC 13.

The display penal 200 of the embodiment may further include at least one timing controller (TCON) 14, which is electrically connected with the ICs 13, for example, via a flexible printed circuit board (FPCB) (disposed between the timing controller 14 and the substrate 11) and signal traces (not shown) (disposed on the substrate 11).

Figure 2B:
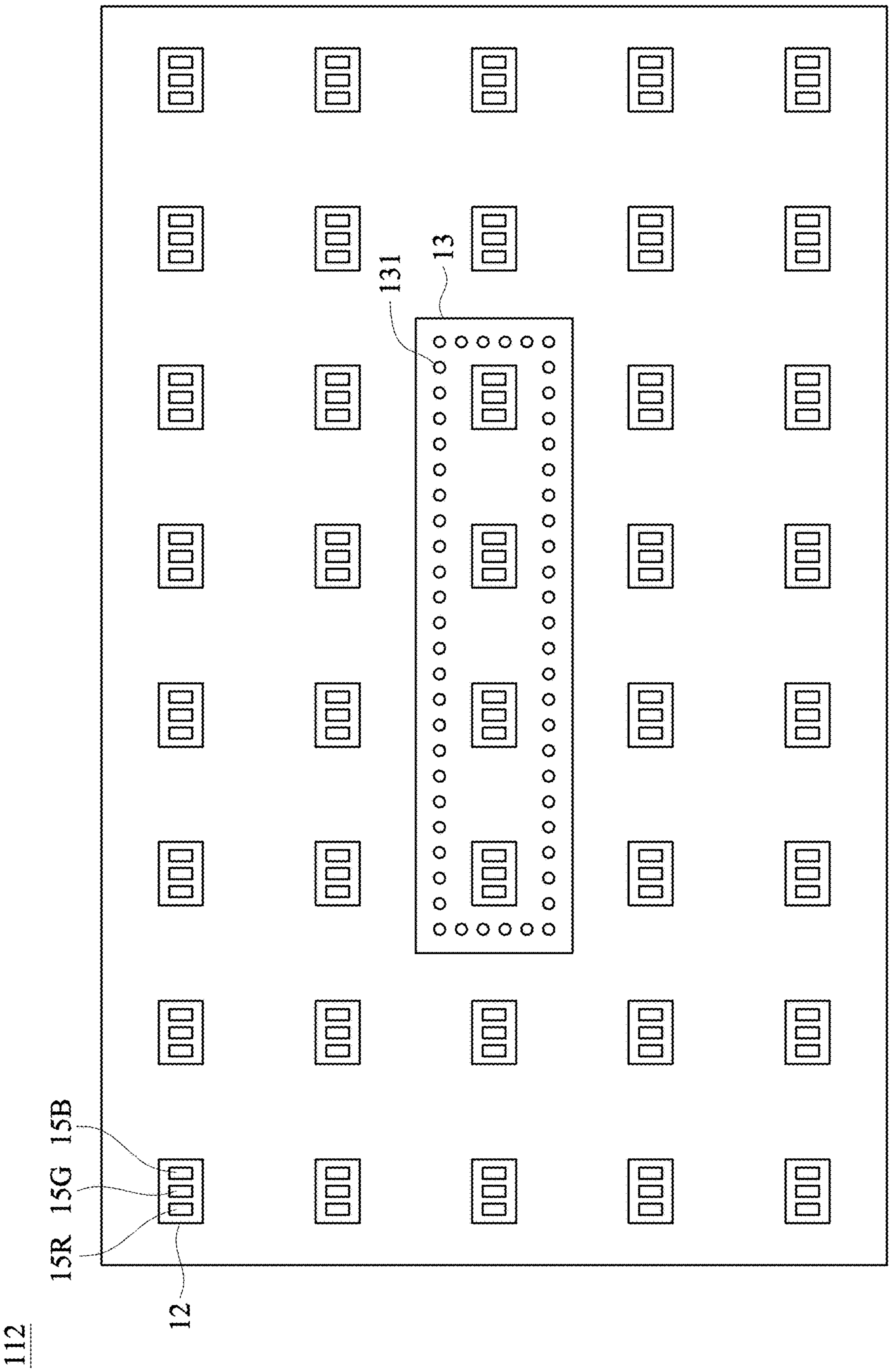
FIG. 2B shows a top view illustrating partial block of the display panel of FIG. 2A.

FIG. 2B shows a top view illustrating partial block 112 of the display panel 200 of FIG. 2A. As exemplified in FIG. 2B, each pixel 12 is composed of a red microLED 15R, a green microLED 15G and a blue microLED 15B. According to one aspect of the embodiment, the IC 13 of the embodiment is disposed above (and covering up) at least one pixel 12, instead of being entirely disposed between adjacent rows of pixels 12 as in the conventional display panels.

Figure 2C:
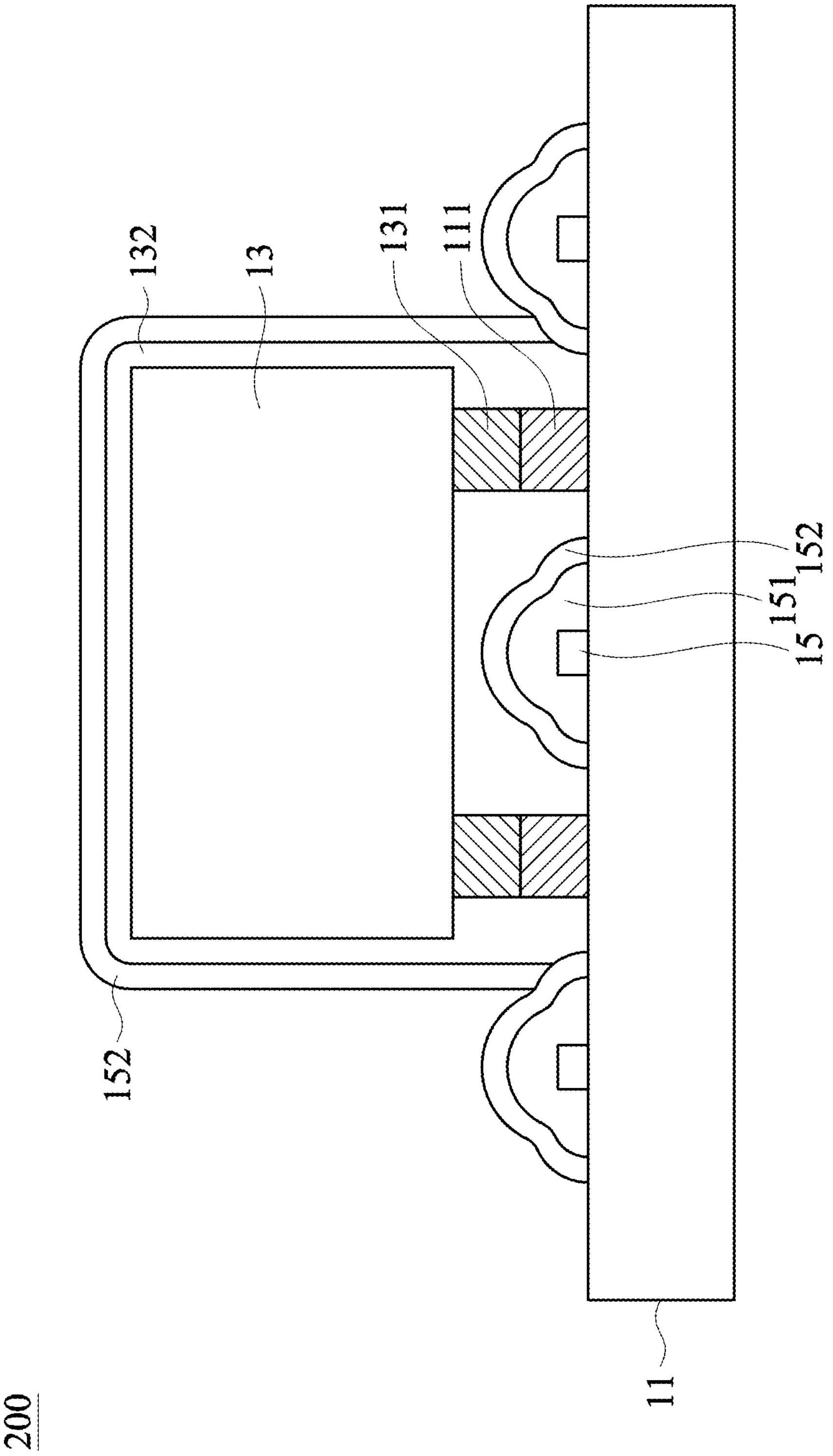
FIG. 2C shows a side view of the display panel of FIG. 2B.

FIG. 2C shows a side view of the display panel 200 of FIG. 2B. In the embodiment, each microLED 15 may be covered (or coated) with an over-coat layer 151, which may be further covered (or coated) with a room-temperature-vulcanizing (RTV) layer 152 (for example, made of silicone).

Specifically, the IC 13 may include a plurality of IC pads 131 disposed on a bottom surface of the IC 13. The block 112 of the substrate 11 may include a plurality of substrate pads 111 corresponding to the IC pads 131 and disposed on a top surface of (the block 112 of) the substrate 11. In the embodiment, as shown in FIG. 2B, the IC pads 131 may be disposed on at least one side of the IC 13. In one embodiment, the IC 13 may be bonded on the substrate 11 via the IC pads 131 and the substrate pads 111, which are interconnected by laser as a heat source. Alternatively, the IC 13 may be bonded on the substrate 11 via anisotropic conductive film (ACF).

Figure 2D:
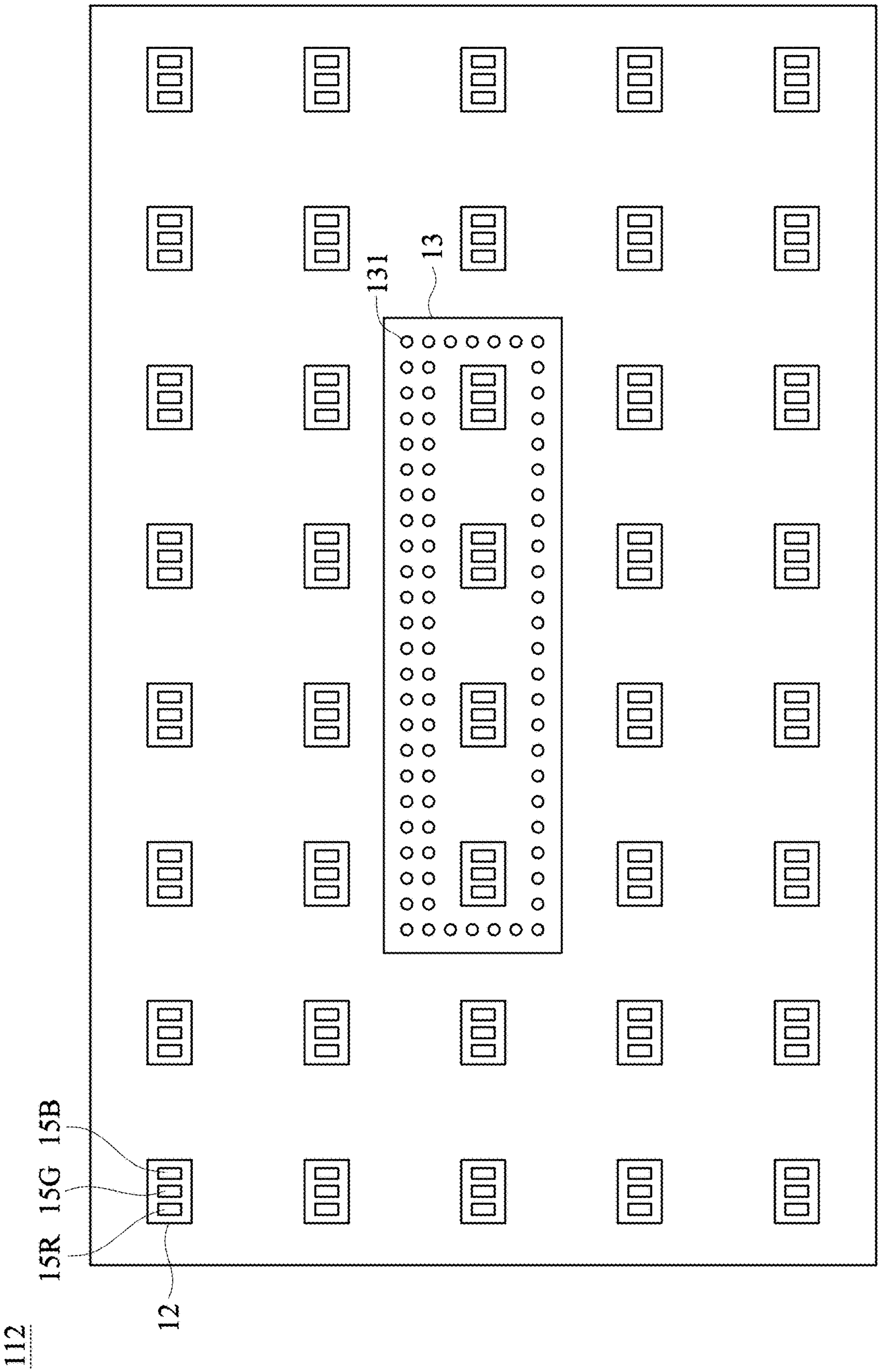
FIG. 2D shows a top view illustrating partial block of the display panel of FIG. 2A according to an alternative second embodiment of the present invention.

FIG. 2D shows a top view illustrating partial block 112 of the display panel 200 of FIG. 2A according to an alternative second embodiment of the present invention. Specifically, the IC pads 131 are disposed on at least two longitudinal rows of the corresponding IC 13, and the longitudinal rows are asymmetrically disposed, for example, on upper part of the IC 13.

According to another aspect of the embodiment, a total height of the IC pad 131 and the substrate pad 111 is (slightly) larger than a height of the microLED 15 (plus the over-coat layer 151 and the RTV layer 152). Generally speaking, a bottom of the IC 13 is (slightly) higher than a top of a packaged microLED 15. As exemplified in FIG. 2C, the IC 13 may be covered (or coated) with an encapsulating layer 132 (e.g., molding compound), which may be further covered (or coated) with the RTV layer 152.

According to the embodiment as described above, as the IC 13 is disposed above the microLEDs 15, instead of being entirely disposed between adjacent rows of microLEDs 15 as in the conventional display panels, the pixel density of the display panel 200 may be substantially increased. Further, the IC 13 may be made bigger having IC pads 131 with increased fan-out, and constraints on size and ratio of the ICs 13 are substantially alleviated.

Moreover, as the total height of the IC pad 131 and the substrate pad 111 of the display panel 200 is larger as compared to the conventional display panels, repairing or re-bonding the ICs 13 according to the embodiment becomes easier with higher yield rate.

Although specific embodiments have been illustrated and described, it will be appreciated by those skilled in the art that various modifications may be made without departing from the scope of the present invention, which is intended to be limited solely by the appended claims.

What is claimed is:

1. A display panel, comprising:

a substrate composed of a plurality of pixels, the substrate comprising an insulating material without metal layer disposed therein; and a plurality of integrated circuits (ICs) disposed above the substrate, each IC including a plurality of IC pads and the substrate including a plurality of substrate pads corresponding to the IC pads and disposed on a top surface of the substrate;

wherein the ICs are bonded on the substrate via the IC pads and the substrate pads, which are interconnected by laser as a heat source;

wherein the IC pads and the substrate pads are in physical contact and are bonded together by the laser.

2. The display panel of claim 1, wherein the plurality of ICs comprise drivers.

3. The display panel of claim 1, wherein the ICs are disposed between adjacent rows of pixels.

4. The display panel of claim 1, wherein the ICs are disposed on a periphery of the substrate.

5. The display panel of claim 1, wherein the IC pads are disposed on a single side of a corresponding IC.

6. The display of claim 1, wherein the IC pads are asymmetrically disposed on at least two longitudinal rows of a corresponding IC.

7. The display panel of claim 1, wherein the ICs are bonded on the substrate without adopting anisotropic conductive film (ACF).

8. A display panel, comprising:

a substrate composed of a plurality of pixels, the substrate comprising an insulating material without metal layer disposed therein and being divided into a plurality of blocks; and a plurality of integrated circuits (ICs) disposed above the plurality of blocks respectively, each IC including a plurality of IC pads and the substrate including a plurality of substrate pads corresponding to the IC pads and disposed on a top surface of the substrate;

wherein each block has at least one corresponding IC disposed above to cover up at least one pixel;

wherein the IC pads and the substrate pads are in physical contact and are bonded together by laser.

9. The display panel of claim 8, wherein the plurality of ICs comprise drivers.

10. The display panel of claim 8, wherein the IC pads are disposed on at least one side of a corresponding IC.

11. The display panel of claim 8, wherein the IC pads are asymmetrically disposed on at least two longitudinal rows of a corresponding IC.

12. The display panel of claim 8, further comprising:

at least one timing controller (TCON) electrically connected with the ICs.

13. The display panel of claim 8, wherein the display panel comprises a bottom-emission micro-light-emitting diode (microLED) display panel.

14. The display panel of claim 13, wherein each pixel comprises a plurality of microLEDs.

15. The display panel of claim 14, wherein a total height of the IC pad and the substrate pad is larger than a height of a microLED.

16. The display panel of claim 14, wherein a bottom of the IC is higher than a top of a microLED.

17. The display panel of claim 14, further comprising:

an over-coat layer covering each microLED; and a room-temperature-vulcanizing (RTV) layer covering the over-coat layer.

18. The display panel of claim 14, further comprising:

an encapsulating layer covering each IC; and a room-temperature-vulcanizing (RTV) layer covering the encapsulating layer.

* * * * *